United States Patent
Box et al.

(10) Patent No.: US 7,489,388 B2
(45) Date of Patent: Feb. 10, 2009

(54) LITHOGRAPHIC APPARATUS AND DEVICE MANUFACTURING METHOD

(75) Inventors: Wilhelmus Josephus Box, Eksel (BE); Hendrik Jan Eggink, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/740,832

(22) Filed: Dec. 22, 2003

(65) Prior Publication Data

US 2005/0134827 A1     Jun. 23, 2005

(51) Int. Cl.
*G03B 27/58* (2006.01)
*G03B 27/62* (2006.01)

(52) U.S. Cl. .......................... 355/72; 355/75
(58) Field of Classification Search .................... 355/30, 355/53, 72, 75–76; 378/34; 310/10
See application file for complete search history.

(56) References Cited

U.S. PATENT DOCUMENTS

| | | | | |
|---|---|---|---|---|
| 5,220,171 | A * | 6/1993 | Hara et al. | 250/443.1 |
| 5,864,386 | A * | 1/1999 | Nei | 355/30 |
| 5,883,932 | A * | 3/1999 | Chiba et al. | 378/34 |
| 6,584,168 | B2 | 6/2003 | Hara et al. | 378/34 |
| 2003/0035088 | A1 * | 2/2003 | Emoto | 355/53 |
| 2003/0164226 | A1 * | 9/2003 | Kanno et al. | 156/345.51 |

FOREIGN PATENT DOCUMENTS

| | | |
|---|---|---|
| EP | 1 052 548 A2 | 11/2000 |
| EP | 1 286 221 A2 | 2/2003 |
| EP | 1 411 391 A2 | 4/2004 |
| EP | 1 447 717 A2 | 8/2004 |
| JP | 2003-68626 | 3/2003 |

OTHER PUBLICATIONS

European Search Report issued for European Patent Application No. 04078390.4-2222, dated Sep. 4, 2006.

* cited by examiner

*Primary Examiner*—Peter B Kim
(74) *Attorney, Agent, or Firm*—Pillsbury Winthrop Shaw Pittman LLP

(57) ABSTRACT

A lithographic apparatus includes an illumination system for projecting a beam of radiation onto a substrate. The lithographic apparatus further has a chuck assembly for supporting at least one of the substrate or a patterning device, the patterning device serving to impart the beam with a pattern in its cross-section. A heat transfer system is operable between a first surface and a second surface. The heat transfer system is capable of transferring heat between the first surface and the second surface. The first surface is at least partially formed by at least a part of the chuck assembly. The second surface is at least partially formed by at least a part of a component spaced a distance from the chuck. The second surface is mechanically isolated from and thermally coupled to the first surface.

18 Claims, 2 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a method of manufacturing a device.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

It is known in the art to provide a lithographic apparatus with a chuck assembly for supporting the substrate and/or patterning device (e.g. a mask or reticle) during operations. A typical prior art chuck assembly includes a chuck provided with a clamp, which for example uses electrostatic or vacuum forces. By the clamp, the substrate or patterning device can be clamped on the chuck, inter alia to retain the flatness of the clamped object. The chuck, in turn, is supported by a frame with respect to other parts of the lithographic apparatus.

However, during the lithographic process, the chuck may be subjected to temperature changes, due to heat transferred from the substrate, for example. The change in temperature affects the accuracy of the projection of the pattern on the substrate, because deformations of the chuck and the thermal changes are, at least to some extent, transferred to the substrate. Even small changes in temperature (e.g. changes smaller than 0.05 K), and in particular thermal inhomogenities of the chuck, give rise to local thermal expansions or shrinkage of the chuck in the order of the suitable precision of the projection, typically in the range of 1 micron to several nanometers.

To reduce the thermal changes in the chuck, it is generally known to provide a thermal system to the chuck which is capable of removing heat from the chuck, to maintain the chuck at a constant temperature level.

From U.S. Pat. No. 5,413,167, for example, a wafer holding block is known which comprises a wafer chuck. The wafer chuck is formed with crossing grooves communicating with a vacuum pump, for vacuum attraction of a wafer. The wafer chuck is fixed on a fine motion stage, for fine alignment of the wafer to a mask. The fine motion stage is provided on a central portion of a support table which is fixed on a rough motion stage for rough alignment of the wafer to the mask. The wafer chuck is made of an aluminum material with a high thermal conductivity. A heat exchanger is fixedly provided on the rough motion stage. The heat exchanger has a passageway coupled with two cooling water pipes. Two flexible heat pipes are used to provide heat transmission between the wafer chuck and the heat exchanger. The heat pipes have opposite end portions made of an aluminum material with good heat conductivity, and a central pipe portion made of a resin material with heat resistivity and a wick wetted with an operative liquid. When operated, heat is transported from the wafer chuck to the heat exchanger via the flexible heat pipes.

From U.S. Pat. No. 6,215,642 a vacuum compatible deformable electrostatic chuck is known. The chuck has a high thermal conductivity. The chuck includes a membrane having a layer of dielectric material, a layer of metallic film and a layer of semiconductor material. Struts and a rim are formed on the layer of semiconductor material. The rim is formed on the periphery of the layer of semiconductor material. The rim and struts contact a surface of a supporting structure and form a hollow area between the membrane and the supporting structure in which a coolant gas is circulated. The supporting structure has gas manifold holes to connect the hollow area with a source of coolant gas. Heat can be transferred away from the chuck via the coolant gas. Between the gas filled hollow area and a backside of the supporting structure, the supporting structure further has a hollow portion in which a coolant liquid is circulated.

From U.S. Pat. No. 5,220,171 a wafer holding block is known, which comprises a wafer chuck. The wafer chuck is formed with crossing grooves communicated with a vacuum pump, for vacuum attraction of a wafer. The wafer chuck is fixed on a fine motion stage, for fine alignment of the wafer to a mask. The fine motion stage is provided on a central portion of a support table which is fixed on a rough motion stage for rough alignment of the wafer to the mask. The wafer chuck is made of an aluminum material with a high thermal conductivity. The chuck has a reduced pressure inside space. A wick wetted with an operative liquid is adhered to the inside wall of the space. A cooling plate with cooling water passageways is interposed between the fine-motion stage and the wafer chuck. By circulation of cooling water through the cooling plate, heat can be transferred from the chuck and the cooling surface of the wafer chuck can be maintained at a temperature of about 20 degrees Celsius.

A drawback of the chuck assemblies known from these prior art documents is that the position of the chuck assembly, and the substrate, with respect to the beam of radiation is subject to vibrations and other distortions originating from the component on which the chuck is fixated. Thereby, the accuracy of the patterning is affected. The distortions are especially disadvantageous in view of current and expected trends in the accuracy requirements due to the decreasing dimensions of the structures projected onto the substrate.

SUMMARY

One aspect of the present invention is to provide a lithographic apparatus in which vibrations and other distortions of the position of a chuck assembly are reduced, and thermal aspects of the chuck assembly can be controlled.

According to an aspect of the invention, there is provided a lithographic apparatus comprising an illumination system constructed to provide a beam of radiation; a patterning device configured to impart a cross-section of the beam of radiation with a pattern; a chuck assembly configured to support at least one of the substrate and the patterning device; a heat transfer system constructed to operate between a first surface and a second surface, the heat transfer system being constructed to transfer heat between the first surface and the second surface, the first surface being at least partially formed by at least a part of the chuck assembly, and the second surface being at least partially formed by at least a part of a component spaced a distance from the chuck assembly, the second surface being mechanically isolated from the first surface and being thermally coupled to the first surface.

In the lithographic apparatus, vibrations or other distortions from the second surface, and thus from the component, are not transferred to the chuck assembly, because the second surface is mechanically isolated and distanced from the chuck assembly. Accordingly, vibrations and other distortions of the chuck assembly are reduced. In addition, the chuck assembly can still be thermally conditioned, since the heat transfer system is capable of transferring heat between the first and second surface.

In an embodiment of a lithographic apparatus according to an aspect of the invention, the heat transfer system is positioned on the component, the heat transfer system being at least thermally in contact with the second surface, and the heat transfer system is capable of transferring heat from the second surface to a position away from the first surface, or vice versa.

In this embodiment, the temperature of the second surface can be changed by transferring heat from the second surface away from the first surface, or vice versa, using the heat transfer system. A heat flow will then occur between the first and second surface, due to the changed temperature of the second surface. Thereby, the position of the chuck assembly is not affected by vibrations or distortions caused by the heat transfer system, because the heat transfer system acts on the second surface, i.e. at the component mechanically isolated from the chuck assembly. Accordingly, vibrations and other distortions acting on the chuck assembly are further reduced.

In an embodiment of a lithographic apparatus according to an aspect of the invention, the heat transfer system comprises at least one thermal sensor capable of determining a thermal aspect of at least a part of the chuck assembly and generating a thermal signal representing a determined value of the thermal aspect of the chuck, and at least one thermal element is connected to the thermal sensor, of which thermal element at least one aspect of heat transfer is controlled in response to the thermal signal.

Thereby, thermal aspects of the chuck assembly can be controlled accurately, since the heat transfer is coupled to the thermal state of the chuck assembly.

In an embodiment of a lithographic apparatus according to an aspect of the invention, the heat transfer system comprises at least two thermal elements which can be controlled separately, for generating a different heat transfer from or to different parts of the first surface.

Thereby, thermal aspects of the chuck assembly can be controlled locally, and, for example, temperature inhomogeneity between different parts of the chuck assembly can be reduced via a suitable control of the thermal elements. In an embodiment of a lithographic apparatus according to an aspect of the invention, the thermal system further comprises at least two thermal sensors, each capable of determining a thermal aspect of at least a part of the chuck assembly and generating a thermal signal representing a determined value of the thermal aspect of the chuck, and at least two of the thermal elements are communicatively connected to different thermal sensors, of which at least one aspect of heat transfer is controlled in response to the thermal signal.

Thus, a thermal element is controlled in relation to the determined thermal aspect, and accordingly, the heat transfer is controlled in relation to the local thermal situation in the chuck assembly. Thereby, thermal differences in the chuck assembly can be reduced, for example.

In an embodiment of a lithographic apparatus according to an aspect of the invention, the heat transfer system comprises a surface heat transfer device capable of transferring heat from or to the second surface, and a bulk heat transfer device positioned in a body of the second component, which bulk heat transfer device is thermally in contact with the surface heat transfer device, for transferring heat from or to the surface heat transfer device.

Thereby, the second surface can be kept at a certain temperature by transferring most of the heat using the bulk heat transfer device, and a correction for changes in the total heat flux can be provided by the surface heat transfer device.

In an embodiment of a lithographic apparatus according to an aspect of the invention, the surface heat transfer device comprises at least one thermo-electric element mounted with a first electrode at the second surface and a second electrode directed towards the bulk heat transfer system.

Thereby, the heat transfer system is of a simple construction which can be controlled in a simple manner by adjusting the amount of current flowing through the thermo-electric element.

In an embodiment of a lithographic apparatus according to an aspect of the invention, the bulk heat transfer device comprises a fluid channel.

Thereby, the bulk heat transfer device can transfer a large amount of heat, and accordingly the body, and second surface can be controlled effectively, because the relatively large heat transferring capacity of a fluid channel filled with a suitable fluid.

According to a further aspect of the invention, there is provided a method of manufacturing a device, comprising projecting a patterned beam of radiation onto a substrate; supporting at least one of the substrate and the patterning device by a chuck assembly; and transferring heat from or to the chuck assembly including transferring heat between at least a part of a chuck assembly surface and a second surface of a component mechanically isolated and at spaced a distance from the chuck assembly.

Thereby, vibrations or other distortions from the second surface are not transferred to the chuck assembly, while the chuck assembly can still be thermally conditioned via the thermal system, because the second surface is mechanically isolated and at a distance from the chuck assembly and the heat transfer system is capable of transferring heat from or to the chuck assembly. Accordingly, vibrations and other distortions of the chuck assembly are reduced.

According to a further embodiment of the invention there is provided a lithographic apparatus comprising means for providing a beam of radiation onto a substrate; means for imparting a cross-section of a beam of radiation; means for supporting at least one of the substrate and the means for imparting a pattern; and means for transferring heat between the means for supporting and a component spaced from, mechanically isolated from, and thermally coupled to the means for supporting.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
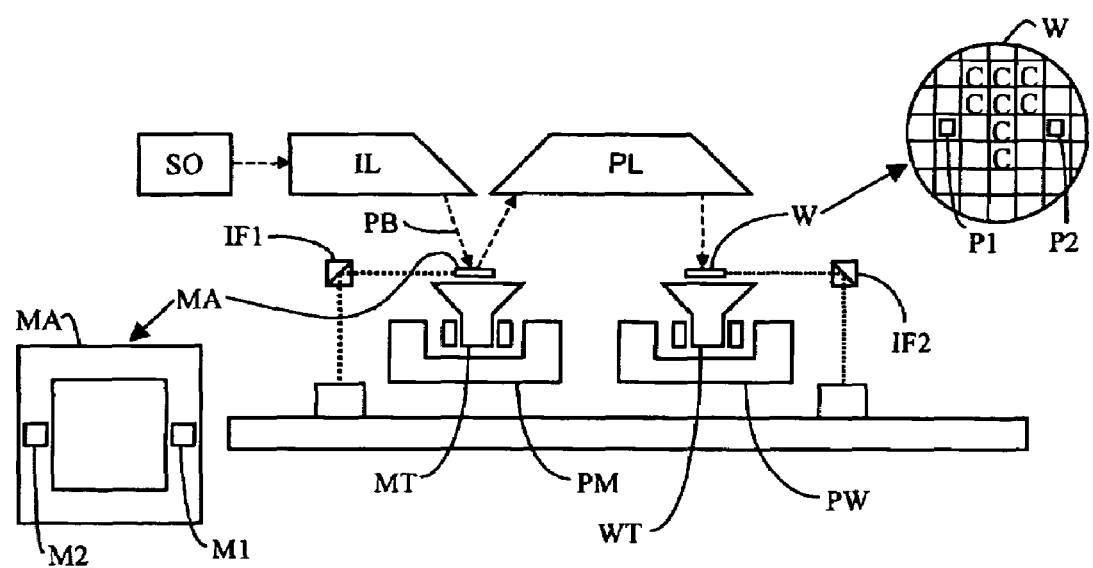
FIG. 1 depicts a lithographic apparatus according to an embodiment of the invention.

FIG. 1 schematically depicts a lithographic apparatus according to an embodiment of the invention. The apparatus comprises: an illumination system (illuminator) IL for providing a beam PB of radiation (e.g. UV or EUV radiation); a first support structure (e.g. a mask table) MT for supporting patterning device (e.g. a mask) MA and connected to first positioning structure PM for accurately positioning the patterning device with respect to a projection system (lens) PL; a substrate table (e.g. a wafer table) WT for holding a substrate (e.g. a resist-coated wafer) W and connected to second positioning structure PW for accurately positioning the substrate with respect to projection system PL; and the projection system (e.g. a reflective projection lens) PL for imaging a pattern imparted to the beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB, having a desired uniformity and intensity distribution in its cross-section.

The beam PB is incident on a patterning device, illustrated in the form of the mask MA, which is held on the mask table MT. Being reflected by the mask MA, the beam PB passes through the lens PL, which focuses the beam onto a target portion C of the substrate W. With the aid of the second positioning structure PW and position sensor IF2 (e.g. an interferometric device), the substrate table WT can be moved accurately, e.g. so as to position different target portions C in the path of the beam PB. Similarly, the first positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structures PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the magnification, demagnification, and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 2:
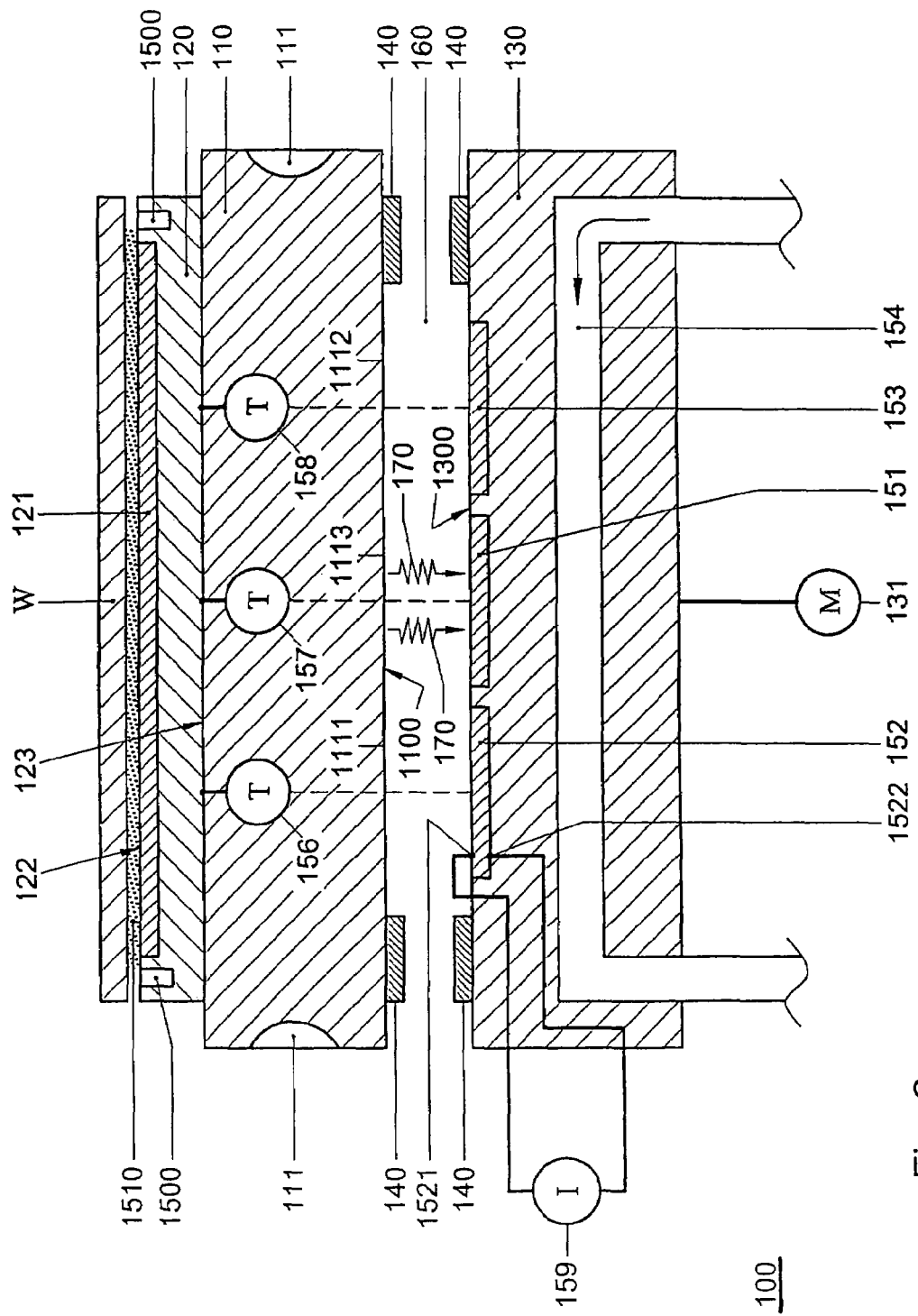
FIG. 2 schematically shows a chuck assembly and a component of a lithographic apparatus according to an embodiment of the invention.

FIG. 2 schematically shows a cross-sectional view of a chuck assembly 100 positioned on a long-stroke module 130. As is explained below, the chuck assembly 100 is mechanically isolated from the long-stroke module 130 The chuck assembly 100 may for example be part of the support structure MT and/or the substrate table WT. In FIG. 2, an object, in this example the substrate W, is supported by a support surface 122 of a chuck 120. The substrate W is clamped onto the support surface 122 by an electrostatic clamp 121. However, the substrate W may also be clamped by another type of clamping device, such as a vacuum clamp or any other suitable clamping device.

In the example of fig.2, the chuck assembly 100 comprises a frame 110 and the chuck 120 which is supported relative to other parts of the lithographic apparatus, e.g. the long-stroke module 130. The frame 110 may be provided with measurement devices. For instance, mirrors 111 are provided at different sides of the frame 110, which can be used in interferometric position determination systems IF1,IF2 of the example of FIG. 1.

In this example, the chuck 120 is rigidly mounted on the frame 110, however other configurations are also possible. For example, the chuck 120 can be an integral part of the frame 110, at the surface 123 or the chuck 120 can be positioned on the frame 110 and be movable with respect to the frame 110.

The long-stroke module 130 is movable with respect to other components of the lithographic apparatus by a schematically depicted motor 131. The chuck assembly 100 is mechanically isolated from the long-stroke module 130. In this example, the chuck assembly 100 is mechanically disconnected from and can be moved with respect to the long-stroke module 130 by Lorentz actuators 140 mounted on the frame 110. The Lorentz actuators 140 also provide an electromagnetic suspension of the chuck assembly 100 with respect to the long-stroke module 130 and thereby provide a spacing 160 between the chuck assembly 100 and the long-stroke module 130. Alternatively the chuck assembly 100 may be mechanically connected but isolated with respect to the long-stroke module 130. For example, the chuck assembly 100 may be connected to the long-stroke module 130 by, for instance, a spring system with a resonance frequency suitable to inhibit transfer of at least a part of vibrations acting on the long-stroke module 130.

A thermal system is provided which operates on the chuck assembly 100 and the long-stroke module 130. The thermal system comprises a first surface 1100 at the chuck assembly 100, in this example a part of the surface of the frame 110. The thermal system further comprises a second surface 1300 that forms a part of the long-stroke module 130 A heat transfer system 151-154 and 156-158 capable of transferring heat between the first surface 1100 and the second surface 1300 is provided to the thermal system as well, as will be explained below in more detail.

In the example of FIG. 2, the first surface 1100 and the second surface 1300 are positioned at respective sides of the spacing 160 and face each other. The thermal system 150 is provided with heat transfer devices 151-154 which are mounted on the long-stroke module 130. The heat transfer devices 151-154 can transfer heat from the second surface 1300 to a position further away from the first surface 1100, or vice versa.

When heat is supplied to, or removed from, the second surface 1300, this will cause a change in the temperature of the second surface 1300, and accordingly a difference in temperature between the first surface 1100 and the second surface 1300 will arise. Due to this difference in temperature, heat will flow between the first surface 1100 and the second surface 1300. Thus, the chuck assembly 100 is cooled or heated.

By the thermal system heat thus can be transferred from the chuck assembly 100 to the component, i.e. the long-stroke module 130, or vice versa, without the need of mechanical contact. The chuck assembly 100 is therefore not subjected to vibrations or distortions which originate from the long-stroke module 130, and are transferred to the chuck assembly 100 via the thermal system.

In the example of FIG. 2, a vacuum system (not shown) may be present, and in use, at least the spacing 160 is pumped to a desired vacuum level. For example in lithographic apparatus using EUV radiation, an ion beam, or an electron beam, a vacuum system is provided to provide at least the path traveled by the beam of radiation with a vacuum. If the spacing 160 is (part of) a vacuum chamber, heat will be transferred between the first surface 1100 and the second surface 1300 by radiation denoted by arrows 170.

In the shown example, the chuck 120 is further provided with a backfill gas system 1500 near the chuck support surface 122. If an object is present at the chuck support surface 122, a backfill gas 1510, such as nitrogen or argon, can be introduced in a void between the object (e.g. substrate or mask) and the chuck 120. Via the backfill gas 1510, the effective heat transfer rate from the object to the chuck 120 can be increased by conduction and/or convection in the backfill gas. The backfill gas 1510 enables an increase of the effective heat transfer rate between the object, e.g. substrate W, and the object support surface 122. In case the chuck 120 and the frame 110 are positioned at a distance from each other, a backfill gas system can also be provided between the frame 110 and the chuck 120 to increase the transfer of heat between the chuck 120 and the frame 110.

In the example of FIG. 2, a vacuum is present in the spacing 160. However, a gas may likewise be present in the spacing 160, in which case, in addition to radiation, conduction and/or convection are heat transferring mechanisms as well. For example, if the lithographic apparatus is a non-vacuum system, or if the spacing 160 is part of a separate chamber shielded from other parts of the lithographic apparatus.

In the example of FIG. 2, the heat transfer system 151-154 and 156-158 comprises a plurality, in this example three, of active thermal elements 151-153, which can be controlled separately. Thus, different heat flows can be generated between different parts 1111-1113 of the first surface 1100, and the second surface 1300. Accordingly, thermal aspects of the chuck assembly 100 can be controlled locally and, for example, thermal inhomogeneities can be reduced.

In the example of FIG. 2, the thermal elements 151-153 are positioned in a row along the second surface 1300. Each of the thermal elements 151-153 faces another part 1111-1113 of the first surface 1100. Accordingly the heat transfer between each of the respective part 1111-1113 of the first surface 1100 and the thermal element 151-153 facing that part can be controlled separately.

In the example of FIG. 2, the thermal system further comprises thermal sensors 156-158, each of which is capable of determining a thermal aspect of a respective part of the chuck assembly 100, for example the temperature. The thermal sensors 156-158 are communicatively connected to the thermal elements 151-153, as is indicated by dashed, lines in the figure shown. In the example, each of the sensors 156-158 is connected to a separate thermal element 151-153. The thermal sensors 156-158 can generate a thermal signal representing a determined value of the thermal aspect of the chuck assembly 100. In response to the thermal signal, the heat transfer for each of the thermal elements is regulated. For example, if the thermal signal indicates a change in temperature, the heat flux towards a separate one of the thermal elements 151-153 can be adapted or the total heat flux can be adapted.

To control the thermal elements 151-153, the thermal sensors 156-158 may also be connected in a different manner than shown in FIG. 2. For example, the thermal sensors 156-158 may be communicatively connected to a processor device which in turn is connected to the respective thermal elements and which provides control signals to the thermal elements 151-153 based on the thermal signal provided by the thermal sensors 156-158.

In this example, the thermal elements 151-153 are implemented as thermo-electric elements. The thermoelectric elements may for example be Peltier elements or any other suitable type of thermo-electric elements. Thermo-electric elements are widely available, and for the sake of briefness are not described in further detail. As shown for the thermo-electric element 152, the elements 151-153 are mounted with a first electrode 1521 at the second surface 1300 and a second electrode 1522 at a side facing away from the second surface 1300, e.g. in FIG. 2 at a side facing towards a bulk heat transfer system, which in this example includes a fluid channel 154. The first electrode 1521 and the second electrode 1522 are connected to a current source 159.

By controlling the current through the thermo-electric element 152, by the current source 159, the heat flow between the first electrode 1521 and second electrode 1522 can be regulated.

In the example of FIG. 2, the thermal system further comprises a fluid channel 154. The fluid channel 154 is positioned in the long-stroke module 130. In the example of FIG. 2, the fluid channel 154 lies below the second surface 1300, in the body of the long-stroke module 130. The fluid channel 154 extends in a plane parallel to the second surface 1300. The fluid channel 154 is thermally in contact with second surface 1300, and more specific in this example thermally in contact with the sides 1522 of the thermo-electric elements 151-153 which are proved with the second electrode, from hereon referred to as the second electrode sides. In general, a fluid channel has a large heat transferring capacity, and accordingly a large amount of heat can be transferred via the fluid channel. The channel 154 can for example be filled with water or another suitable liquid, a gas or a gas/liquid mixture, which is circulated in the channel 154 in the long-stroke module 130 and brought to a desired temperature outside the long-stroke module 130 by a heat exchanger, for instance, thus transferring heat from the body of the long-stroke module 130 outside of the module 130.

For transferring the heat from the long stroke body 130, as an alternative, heat pipes can be used. Heat pipes are generally composed of a closed tube with a phase change medium, such as a fluid in it. Heat entering at one side of the tube is absorbed by the medium and causes a phase change of the medium, such as boiling of a liquid which turns it into a vapor. The phase-changed medium is then transported to another side of the tube at which the medium returns to its original phase and releases heat. For example in case of a boiling liquid, the vapor expands in volume and travels to another part of the heat pipe where the vapor condenses to a liquid and releases heat. The medium is then transported to its original position, for example by gravity or a wick, and the heat change cycle is started again.

In the example of FIG. 2, the row of thermoelectric elements 151-153 acts as a surface heat transfer device which can transfer heat to or absorb heat from the second surface 1300. The fluid channel 154 acts as a bulk heat transfer device positioned in a body of the long stroke module 120 adjacent to the second surface 1300. The bulk heat transfer device is thermally in contact with the surface heat transfer devices, and can transfer heat from or to the surface heat transfer devices. Thus, the bulk heat transfer device maintains the long-stroke module 130 at a more or less constant temperature, while the thermo-electric elements can correct for local or temporal distortions of the constant temperature, and thereby provide a suitable heat transfer between the chuck assembly 100 and the long stroke module 130.

While specific embodiments of the invention have been described above, it will be appreciated that aspects of the invention may be practiced otherwise than as described. For instance in the example of FIG. 2, the fluid channel 154 may be provided with a cooling fluid which removes heat from the long-stroke module 130, while the thermal elements 151-153 are operated as heating devices which locally heat the second surface 1300. Also, the first surface may be provided with thermal elements to improve the transfer of heat from the body of the frame 110 and/or the chuck 120 towards the first surface 1100. Further, the thermal system can be operated as a cooling system, in which case heat is removed from the first surface 1100 by the thermal system. The thermal system can also operate as a heating system, in which case heat is brought to the first surface 1100 by the thermal system.

The description is not intended to limit aspects of the invention.

What is claimed is:

1. A lithographic apparatus comprising:
   an illumination system constructed to provide a beam of radiation onto a substrate;
   a patterning device configured to impart a cross-section of said beam of radiation with a pattern;
   a chuck assembly constructed to support said substrate or said patterning device;
   a long-stroke module constructed to at least partially position said chuck assembly relative to other components of the lithographic apparatus, the long-stroke module being vibrationally isolated from said chuck assembly; and
   a heat transfer system constructed to transfer heat between a first surface and a second surface, said first surface being formed by said chuck assembly, and
   said second surface being formed by said long-stroke module, said second surface being spaced a distance from said first surface so as to define a substantially empty space between the first surface and the second surface, the empty space extending over substantially the area defined by the second surface, said second surface being thermally coupled to said first surface, wherein
   said heat transfer system includes a surface heat transfer device capable of transferring heat from or to said second surface, a portion of said surface heat transfer device being positioned at the second surface, and
   a bulk heat transfer device positioned in the long-stroke module, said bulk heat transfer device being in thermal contact with said surface heat transfer device to transfer heat from or to said surface heat transfer device.

2. A lithographic apparatus according to claim 1, wherein said heat transfer system is positioned on said long-stroke module, said heat transfer system is at least thermally in contact with said second surface, and said heat transfer system is capable of transferring heat between said second surface and a position away from said first surface.

3. A lithographic apparatus according to claim 1, wherein said heat transfer system includes
   at least one thermal sensor constructed to determine a thermal aspect of at least a part of said chuck assembly and to generate a thermal signal representing a determined value of said thermal aspect of said chuck assembly, and
   at least one thermal element connected to said thermal sensor to control said thermal aspect in response to said thermal signal.

4. A lithographic apparatus according to claim 3, wherein said at least one thermal sensor is at least two thermal sensors, each of said at least two thermal sensors being constructed to determine a thermal aspect of at least a part of said chuck assembly and to generate a thermal signal representing a determined value of said thermal aspect of said chuck assembly,
   and wherein at least two of said thermal elements are communicatively connected to different thermal sensors, said thermal sensors being constructed to control at least one aspect of heat transfer in response to said thermal signal.

5. A lithographic apparatus according to claim 1, wherein said heat transfer system includes at least two thermal elements, each of said at least two thermal elements being constructed to be separately controlled and to distinctly generate heat transfer between different parts of said first surface of said chuck assembly.

6. A lithographic apparatus according to claim 1, wherein said surface heat transfer device includes at least one thermo-electric element mounted with a first electrode at said second surface and a second electrode directed towards said bulk heat transfer device.

7. A lithographic apparatus according to claim 6, wherein said surface heat transfer device includes a plurality of thermo-electric elements positioned in a row along said second surface.

8. A lithographic apparatus according to claim 7, wherein the thermo-electric elements are Peltier elements.

9. Presented) A lithographic apparatus according to claim 1, wherein said bulk heat transfer device includes a fluid channel.

10. A lithographic apparatus according to claim 1, wherein said bulk heat transfer device comprises a heat pipe channel.

11. A lithographic apparatus according to claim 1, wherein gas is provided between the first and the second surface and wherein heat is transferred from or to said second surface by radiation, or convection or both.

12. A lithographic apparatus comprising:
    an illumination system constructed to provide a beam of radiation onto a substrate;
    a patterning device configured to impart a cross-section of said beam of radiation with a pattern;
    a chuck assembly constructed to support said substrate or said patterning device; and
    a heat transfer system constructed to transfer heat between a first surface and a second surface, said first surface being formed by said chuck assembly, and said second surface being formed by a component of the lithographic apparatus spaced a distance from said chuck assembly, said second surface being vibrationally isolated from said first surface and being thermally coupled to said first surface, the chuck assembly being spaced apart from the component so as to define a substantially empty space between the first surface and the second surface, the empty space extending over substantially the area defined by the second surface,
    said heat transfer system comprising a surface heat transfer device capable of transferring heat from or to said second surface, said surface heat transfer device having a surface that is lying in the plane of the second surface, and a bulk heat transfer device positioned in the component, said bulk heat transfer device being in thermal contact with said surface heat transfer device to transfer heat from or to said surface heat transfer device.

13. A lithographic apparatus according to claim 12, wherein the component is a long-stroke module.

14. lithographic apparatus according to claim 12, wherein gas is provided between the first and the second surface and wherein heat is transferred from or to said second surface by radiation, or convection or both.

15. A lithographic apparatus comprising:
    an illumination system constructed to provide a beam of radiation onto a substrate;
    a patterning device configured to impart a cross-section of said beam of radiation with a pattern;

a chuck assembly constructed to support said substrate or said patterning device;

a heat transfer system constructed to transfer heat between a first surface and a second surface, said first surface being formed by said chuck assembly, and said second surface being formed by a component of the lithographic apparatus spaced a distance from said chuck assembly, said second surface being vibrationally isolated from said first surface and being thermally coupled to said first surface, the chuck assembly being spaced apart from the component so as to define a substantially empty space between the first surface and the second surface, the empty space extending over substantially the area defined by the second surface, said heat transfer system comprising a surface heat transfer device capable of transferring heat from or to said second surface, a portion of said surface heat transfer device being positioned at the second surface, and a bulk heat transfer device positioned in the component, said bulk heat transfer device being in thermal contact with said surface heat transfer device to transfer heat from or to said surface heat transfer device; and an actuator constructed and arranged to move the chuck assembly relative to the component, at least a portion of the actuator being supported by the component at the second surface.

16. A lithographic apparatus according to claim 15, wherein the actuator comprises another portion located at the first surface that is substantially parallel to the portion of the actuator being supported by the component at the second surface.

17. A lithographic apparatus according to claim 15, wherein the component is a long-stroke module.

18. A lithographic apparatus according to claim 15, wherein gas is provided between the first and the second surface and wherein heat is transferred from or to said second surface by radiation, or convection or both.

* * * * *